(12) United States Patent
Lim et al.

(10) Patent No.: US 7,804,361 B2
(45) Date of Patent: Sep. 28, 2010

(54) LOW NOISE AMPLIFIER

(75) Inventors: Hyung-sun Lim, Hwaseong-si (KR);
Jin-soo Park, Suwon-si (KR);
Heung-bae Lee, Suwon-si (KR);
Young-eil Kim, Suwon-si (KR);
Sang-yoon Jeon, Seoul (KR); Ick-jin Kwon, Hwaseong-si (KR); Bum-man Kim, Pohang-si (KR); Je-hyung Yoon, Pohang-si (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 49 days.

(21) Appl. No.: 12/195,615

(22) Filed: Aug. 21, 2008

(65) Prior Publication Data
US 2009/0212861 A1   Aug. 27, 2009

(30) Foreign Application Priority Data
Feb. 22, 2008   (KR) .................... 10-2008-0016496

(51) Int. Cl.
*H03F 3/45* (2006.01)
(52) U.S. Cl. ...................... 330/253; 330/277
(58) Field of Classification Search ................ 330/253, 330/277
See application file for complete search history.

(56) References Cited

U.S. PATENT DOCUMENTS

| | | | |
|---|---|---|---|
| 6,392,486 B1 * | 5/2002 | Lemay, Jr. ................ | 330/253 |
| 7,202,741 B2 | 4/2007 | Park et al. | |
| 7,521,996 B2 * | 4/2009 | Kluge ..................... | 330/253 |
| 2009/0108944 A1 * | 4/2009 | Kuo et al. ................. | 330/306 |

FOREIGN PATENT DOCUMENTS

| | | |
|---|---|---|
| JP | 2000-151286 | 5/2000 |
| JP | 2001-196966 | 7/2001 |
| KR | 10-2001-0044705 | 6/2001 |
| KR | 10-2001-0044898 | 6/2001 |
| KR | 10-2006-0047002 | 5/2006 |

OTHER PUBLICATIONS

English language abstract of JP 2000-151286, published May 30, 2000.
Machine English language translation of JP 2000-151286, published May 30, 2000.
English language abstract of JP 2001-196966, published Jul. 19, 2001.

(Continued)

*Primary Examiner*—Khanh V Nguyen
(74) *Attorney, Agent, or Firm*—NSIP Law

(57) ABSTRACT

A low noise amplifier is provided. The low noise amplifier includes: a low noise amplifying unit amplifying an input signal; a harmonic and noise generating unit disposed in an input terminal of the low noise amplifying unit, for generating a compensating signal for compensating for an intermodulation distortion signal and a thermal noise signal of the input signal to the low noise amplifying unit; and a load unit outputting the amplified input signal generated by the low noise amplifying unit.

20 Claims, 7 Drawing Sheets

OTHER PUBLICATIONS

Machine English language translation of JP 2001-196966, published Jul. 19, 2001.
English language abstract of KR 10-2001-0044705, published Jun. 5, 2001.
English language abstract of KR 10-2001-0044898, published Jun. 5, 2001.
English language abstract of KR 10-2006-0047002, published May 18, 2006.

* cited by examiner

LOW NOISE AMPLIFIER

CROSS REFERENCE TO RELATED APPLICATIONS

This application claims priority from Korean Patent Application No. 10-2008-0016496, filed on Feb. 22, 2008, the disclosure of which is incorporated herein in its entirety by reference.

BACKGROUND OF THE INVENTION

1. Field of the Invention

The present invention relates to a low noise amplifier, and more particularly, to a low noise amplifier for improving linearity.

2. Description of the Related Art

In Radio Frequency (RF) receiver, a low noise amplifier is used to provide appropriate gain according to the amplitude of signals which are received through an antenna. A low noise amplifier desirably amplifies a weak RF signal received through an antenna in a wireless system without exacerbating the effects of the noise. Recently, most mobile communication systems require a software defined radio (SDR) to provide various mobile communication services, such as Bluetooth, Personal Communication Services (PCSs), and Global Positioning System (GPS), using a single RF-IC chip, in mobile communication equipment. In order to satisfy SDR, there is required a broadband low noise amplifier which is different from an existing low noise amplifier which operates in a narrow-band.

SUMMARY OF THE INVENTION

The present invention provides a low noise amplifier for improving linearity and noise factor.

According to an aspect of the present invention, there is provided a low noise amplifier, which may include: a low noise amplifying unit amplifying an input signal; a harmonic and noise generating unit disposed in an input terminal of the low noise amplifying unit, and generating a compensating signal for compensating for an intermodulation distortion signal and a thermal noise signal for the input signal generated by the low noise amplifying unit; and a load unit outputting the amplified input signal generated by the low noise amplifying unit.

The harmonic and noise amplifying unit and the low noise amplifying unit may be connected in series to each other. The harmonic and noise generating unit may generate an intermodulation distortion compensation signal phase-shifted by 180° from the intermodulation distortion signal generated by the low noise amplifying unit. The harmonic and noise generating unit may further generate a thermal noise compensation signal phase-shifted by 180° from that of a thermal noise signal generated by the low noise amplifying unit.

The low noise amplifying unit may be a common gate differential amplifier including at least one field effect transistor (FET).

The harmonic and noise generating unit may be a common source differential amplifier including at least one field effect transistor (FET), and the harmonic and noise generating unit and the low noise amplifying unit may receive the same input signal, and the drain of the at least one FET may be connected to the gate of another FET, which receives a differential input signal for an input signal of the at least one FET, and which is connected in series to an input terminal of the low noise amplifying unit.

The load unit may comprise a resistor and an inductor connected in series to the resistor, and outputs a signal generated between the resistor and the inductor.

Additional aspects of the invention will be set forth in the description which follows, and in part will be apparent from the description, or may be learned by practice of the invention.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the aspects of the invention.

DETAILED DESCRIPTION OF EXEMPLARY EMBODIMENTS

Figure 1:
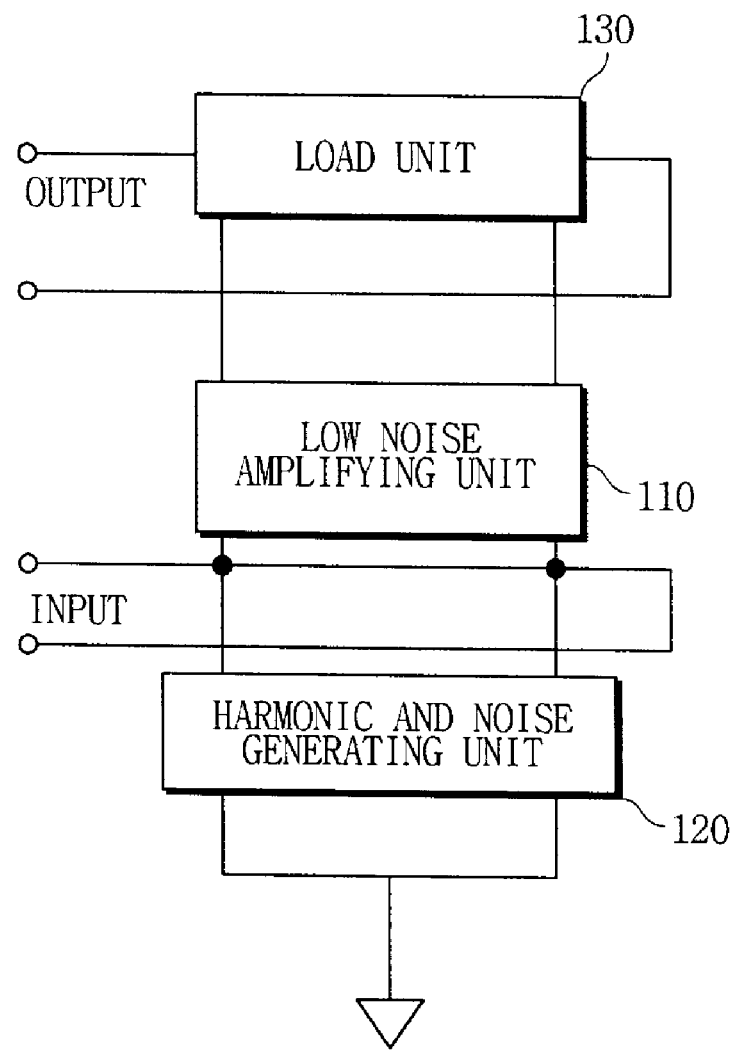
FIG. 1 is a block diagram of a low noise amplifier according to an embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

FIG. 1 is a block diagram of a low noise amplifier according to an embodiment of the present invention.

The low noise amplifier may be used to improve linearity and remove thermal noise, and may include a low noise amplifying unit 110, a harmonic and noise generator 120, and a load unit 130.

The low noise amplifying unit 110 may be a common gate amplifier for amplifying differential input signals. The harmonic and noise generator 120 is connected to input terminals of the low noise amplifying unit 110, and may function as a current source of the common gate amplifier.

Gain can be represented by $G_m \times R_L$, wherein $G_m$ is transconductance and $R_L$ is output resistance of a load.

The value of $G_m$ depends on a current source. Accordingly, current influences gain of a circuit, and transistors and bias values used in the low noise amplifying unit 110 depend on an input current value. Since the amplitudes of distortion components depend on bias values, linearity depends on bias values, and since transistors generate thermal noise depending on an input current value, a noise factor (NF) depends on the input current value.

That is, the harmonic and noise generator 120, which functions as a current source as described above, adjusts the current of overall stages of the low noise amplifying unit 110, and defines gain, linearity, and a noise factor through the current.

According to an embodiment of the present invention, the harmonic and noise generator 120 generates compensation signals for compensating for noise signals including, e.g., an intermodulation distortion (IMD) signal and/or a thermal noise signal for an input signal generated by the low noise amplifying unit 110.

Intermodulation distortion means a phenomenon in which an output frequency component combined by a sum and difference between harmonic frequencies of two signals having different frequencies is generated when RF signals are processed by non-linear devices, such as diodes or transistors. That is, intermodulation distortion occurs when signals having two or more frequencies are simultaneously processed to distort an original signal.

Thermal noise means high-frequency noise which influences a desired signal because the high-frequency noise is mixed with a signal generated by a transistor in a circuit operating at a high frequency.

The harmonic and noise generator 120 generates an intermodulation distortion compensation signal phase-shifted by 180° from that of the intermodulation distortion (IMD) signal generated by the low noise amplifying unit 110, and/or a thermal noise compensation signal phase-shifted by 180° from that of the thermal noise signal generated by the low noise amplifying unit 110.

The harmonic and noise generator 120 is connected in series to the low noise amplifying unit 110. That is, a compensation signal and a differential input signal may be coupled, and may be transferred to the low noise amplifying unit 110, without a coupler circuit of the harmonic and noise generator 120. Accordingly, no additional current consumption may be required by the harmonic and noise generator 120.

The load unit 130 outputs a signal amplified by the low noise amplifying unit 110. A signal input to the low noise amplifying unit 110 may be amplified and output as a current signal, and the current signal is input to the load unit 130, and may be converted into voltage gain by the load unit 130.

Figure 2:
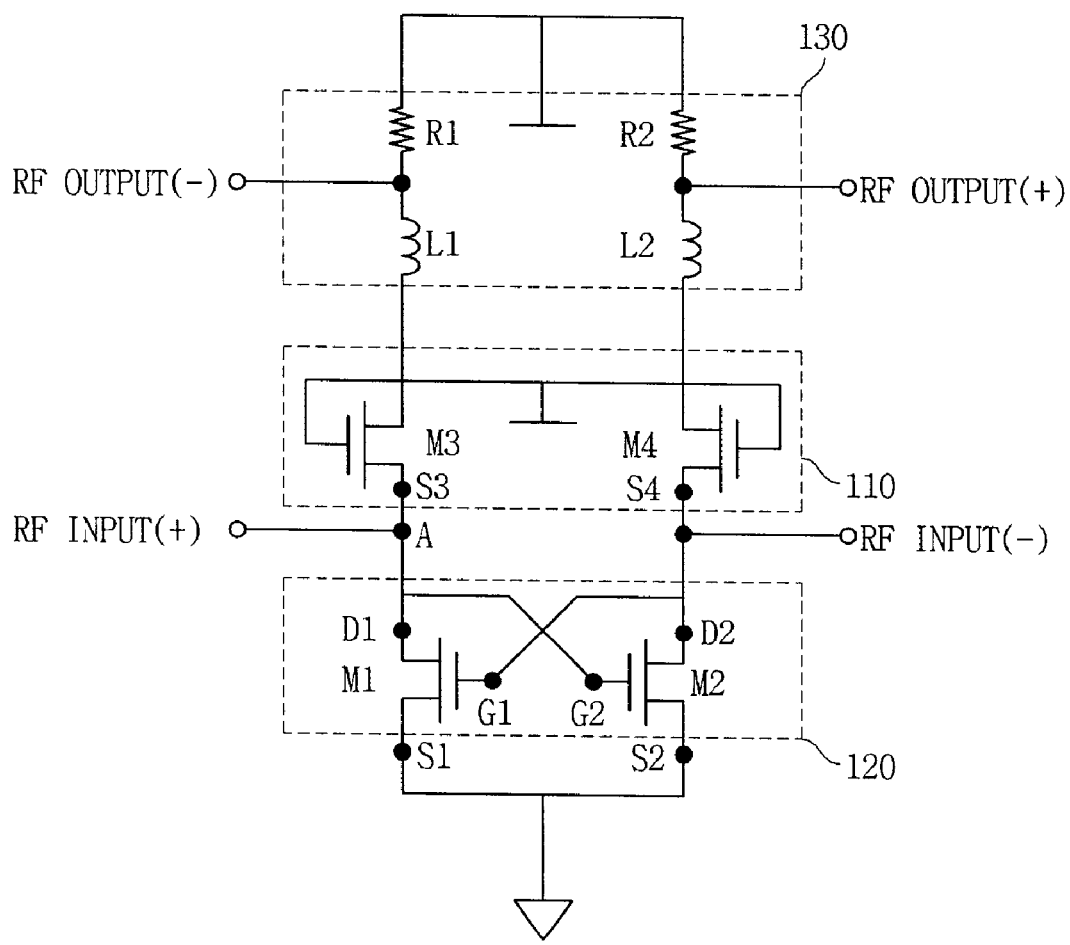
FIG. 2 is a circuit diagram of the low noise amplifier illustrated in FIG. 1.

FIG. 2 is a circuit diagram of the low noise amplifier illustrated in FIG. 1.

The low noise amplifying unit 110 may be a common gate (CG) amplifier which receives differential inputs through field-effect transistors (FETs) M3 and M4. The harmonic and noise generator 120 is connected in series to input terminals of the low noise amplifying unit 110, and accordingly, the harmonic and noise generator 120 and the low noise amplifying unit 110 receive the same input signal. The harmonic and noise generator 120 may be a common source (CS) amplifier including FETs M1 and M2.

Here, the FETs M1 through M4 may be NMOSFETs having the same shape and size.

Also, the drain D1 of the FET M1 is connected to the gate G2 of the FET M2 and the drain D2 of the FET M2 is connected to the gate G1 of the FET M1, wherein the FETs M1 and M2 receive different input signals. Also, the harmonic and noise generator 120 is connected in series to the sources S3 and S4 of the FETs M3 and M4 constructing the low noise amplifying unit 110.

The load unit 130 includes resistors R1 and R2 and inductors L1 and L2, and converts an amplified current signal into a voltage signal through load impedance. Output signals of the load unit 130 are output from connections between the resistors R1 and R2 and inductors L1 and L2. Output impedance of the load unit 130 is generated with parasitic capacitance Cdg (not shown) generated by the FETs M3 and M4.

Accordingly, the load unit 130 has broadband impedance since the load unit 130 is formed in the form of a ladder filter consisting of inductors, capacitors, and resistors. Accordingly, broadband, flat voltage gain can be obtained.

A Software Defined Ratio (SDR) is used to operate various services in a single chip. For the use of a SDR, a broadband, low noise amplifier which can amplify signals having various bandwidths is needed. The broadband, low noise amplifier receives signals having all desired bandwidths through broadband matching, and amplifies the amplitudes of signals to a predetermined amplitude. The broadband, low noise amplifier receives a signal having a desired bandwidth through broadband matching, and can amplify the amplitude of the signal to a predetermined amplitude when the impedance of true load unit remains constant at all desired bandwidths. Accordingly, the load unit 130 requires flat impedance at desired broadbands. Accordingly, the low noise amplifier including the load unit 130, as illustrated in FIG. 2, can be used as a broadband, low noise amplifier for use of a SDR.

Figure 3:
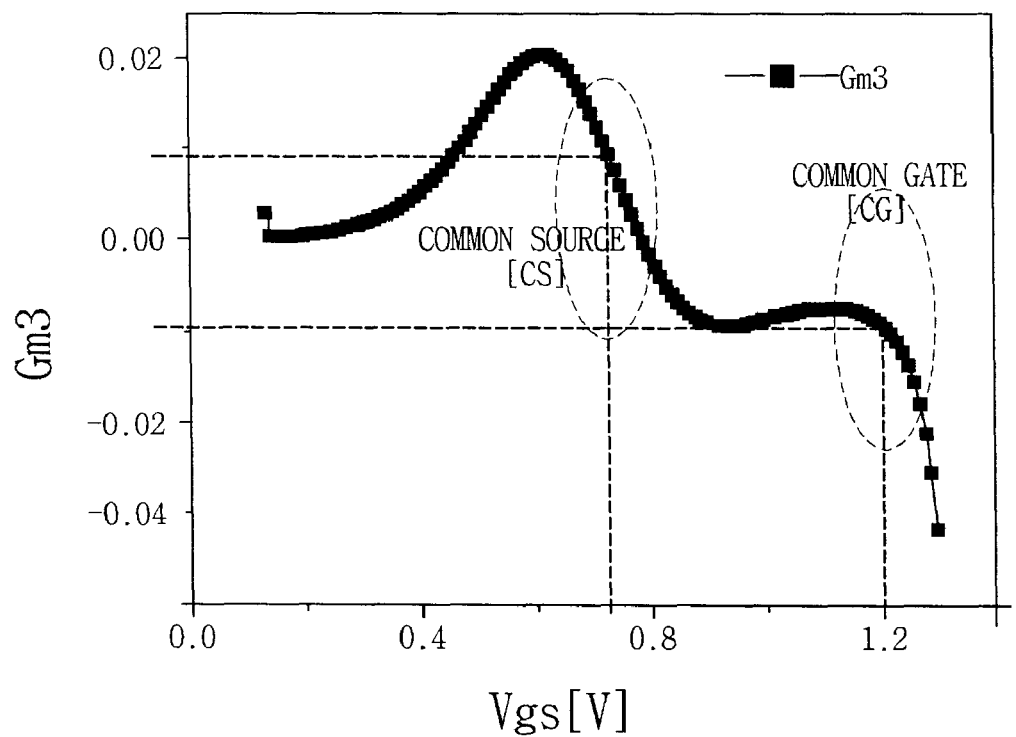
FIG. 3 is a graph plotting $3^{rd}$ order transconductance (Gm3) values of a common gate and a common source.

FIG. 3 is a graph plotting $3^{rd}$ order transconductance (Gm3) values of a common gate and a common source.

$3^{rd}$ order intermodulation among non-linear characteristics of an RF circuit is important in linearity performance. This is because an intermodulation (IMD) signal is generated with an output signal due to IMD3 ($3^{rd}$ intermodulation distortion) and such an IMD signal cannot be easily removed by a filter.

FIG. 3 is a graph in which Gm3 values of a common gate and a common source are represented when a bias voltage Vgs is in the range of 0 through 1.2 V. It is known to those skilled in the art that if Gm3 is a value approaching 0, IIP3 (input power of a third order intercept point) increases and linearity increases according to the increase of the IIP3.

As shown in FIG. 3, Gm3 of the common gate is a negative (−) value, and Gm3 of the common source is a positive (+) value. Accordingly, as shown in FIG. 3, if a bias voltage Vgs suitable for CG and CS circuits is selected, Gm3 values which can cancel each other can be obtained.

Accordingly, the harmonic and noise generator 120 is designed so that it has a Gm3 value which can offset a Gm3 value of the low noise amplifying unit 110 illustrated in FIG. 2. That is, the harmonic and noise generator 120 is designed so that the sizes of transistors and the bias voltage are set to cancel the Gm3 values of the low noise amplifying unit 110 while supplying appropriate current to the low noise amplifying unit 110.

Figure 4:
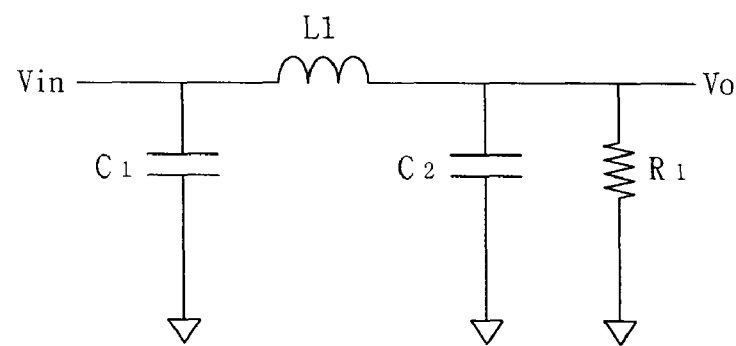
FIG. 4 shows an equivalent circuit of a load unit according to an embodiment of the present invention.

FIG. 4 shows an equivalent circuit of the load unit 130 according to an embodiment of the present invention.

Referring to FIG. 4, the load unit 130 includes an inductor L1 and a resistor $R_1$, and parasitic capacitances $C_1$ and $C_2$ are capacitances naturally generated without forming capacitors in the circuit. Referring to FIGS. 2 and 4, the parasitic capacitance $C_1$ is generated from the transistors M3 and M4, and the parasitic capacitance $C_2$ is generated from an output of the low noise amplifying unit 110.

The circuit illustrated in FIG. 4 functions as a bandpass filter in view of its impedance. That is, the circuit has more flat impedance at a specific frequency band compared to an existing circuit including only inductors and resistors.

Figure 5A:
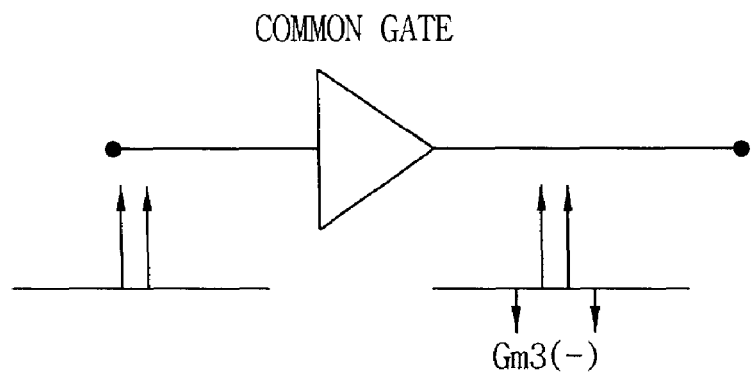
FIGS. 5A and 5B illustrate changes of waveforms input to and output from a common gate and a common source.
Figure 5B:
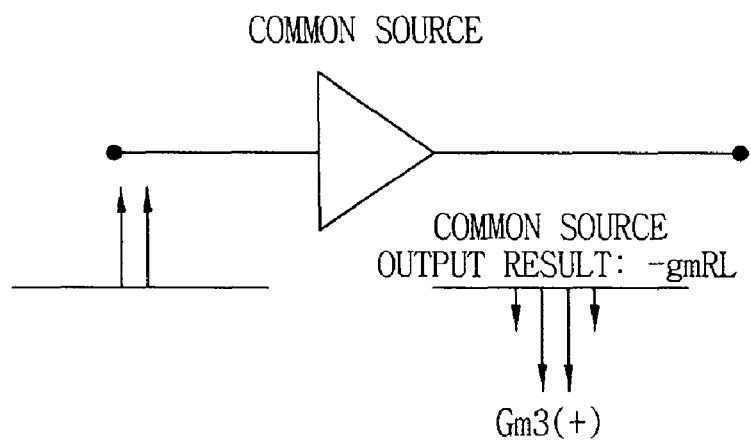

FIGS. 5A and 5B are views for explaining changes of waveforms output from a common gate and a common source.

As illustrated in FIG. 5A, an input signal which is input to a common gate is output without any change in phase. However, an intermodulation distortion (IMD) signal, which is a Gm3 component of a common gate (CG) amplifier, is output with a phase shifted by 180° from that of the input signal.

Meanwhile, as illustrated in FIG. 5B, a common source (CS) amplifier shifts the output phase of a fundamental signal by 180° and then outputs the phase-shifted signal ($V_{out}$=−$gmR_L$). In the case of the common source (CS) amplifier, a Gm3 component is output with the same phase as an output of a fundamental signal.

Figure 6:
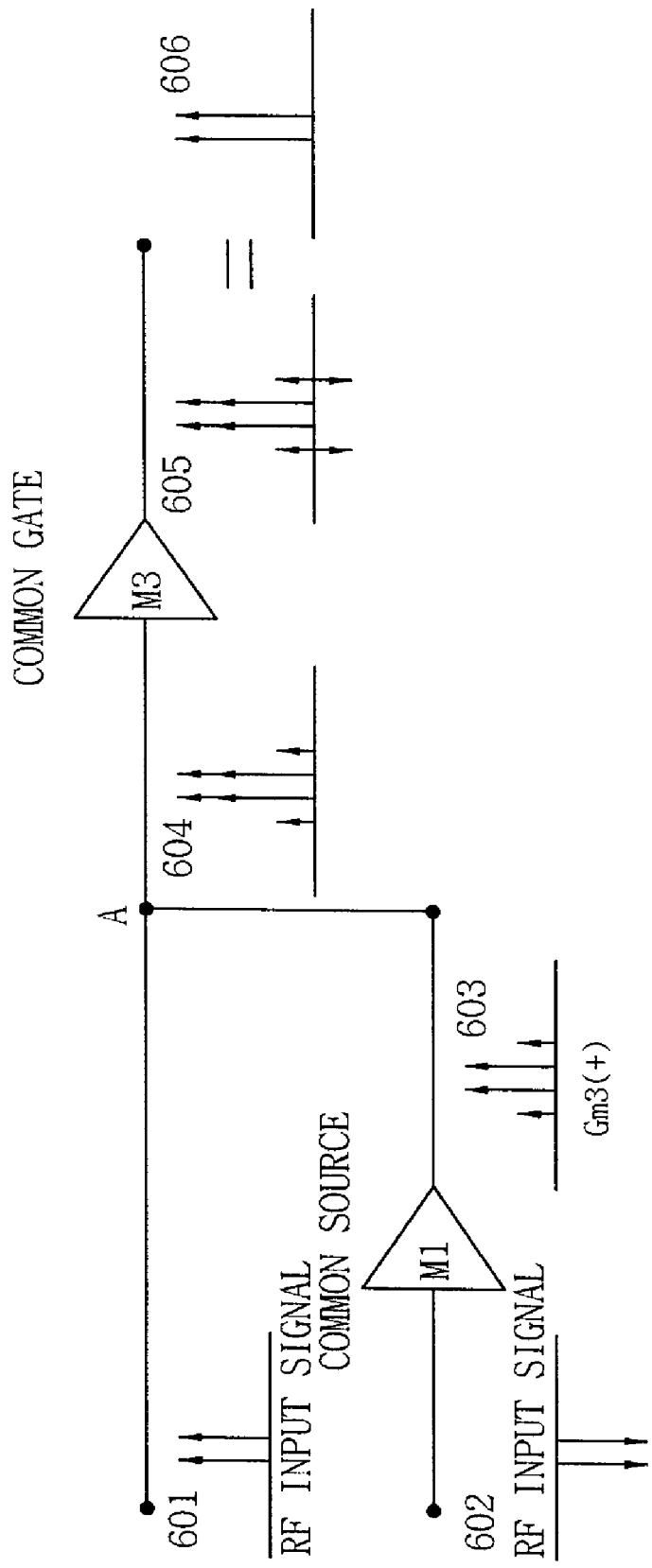
FIG. 6 illustrates an effect that linearity is improved by utilizing the low noise amplifier illustrated in FIG. 1.

FIG. 6 is a view for explaining an effect that linearity is improved by utilizing the low noise amplifier illustrated in FIG. 1.

Referring to FIGS. 2 and 6, when seen from a node A, a positive (+) input signal is added to a component generated by the harmonic and noise generator 120 which is a common source, and then input to the low noise amplifying unit 110 which is a common gate. In signal diagrams illustrated in FIG. 6, horizontal axes represent the frequencies of the signals and vertical axes represent the amplitudes of the signals.

In detail, signals 601 and 602 which are received through an antenna are differentially input to the low noise amplifying unit 110. The signal 602 passes through a FET M1 of the harmonic and noise generator 120, and then output as a signal 603 including fundamental components and harmonic components.

The signal 601 and the signal 603 are added and output in the form of a signal 604 to a FET M3 of the low noise amplifying unit 110. An intermodulation distortion signal of the signal 604 is cancelled when the signal 604 passes through the FET M3 of the low noise amplifying unit 110, and as a result, a signal 605 (that is, a signal 606) is generated. Accordingly, linearity can be improved.

Figure 7A:
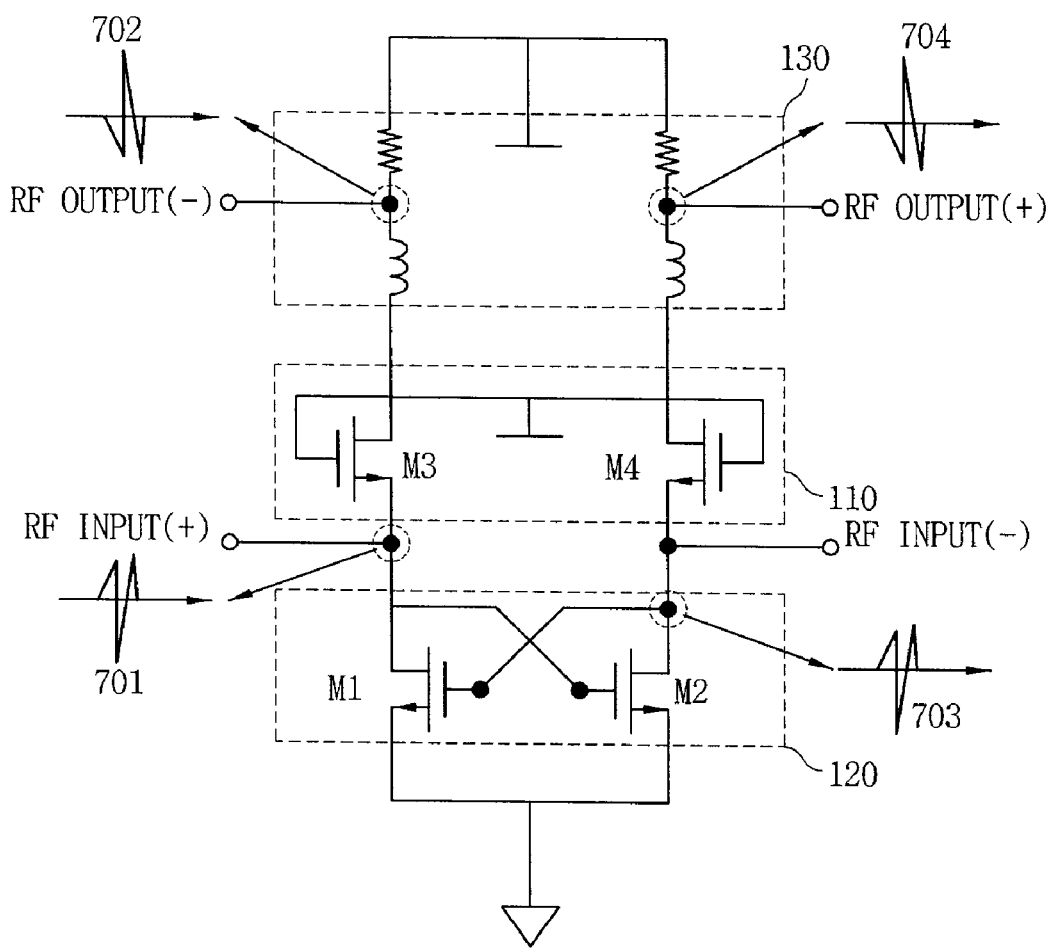
FIGS. 7A and 7B illustrate a process of removing a thermal noise signal, which is performed by the low noise amplifier illustrated in FIG. 1.
Figure 7B:
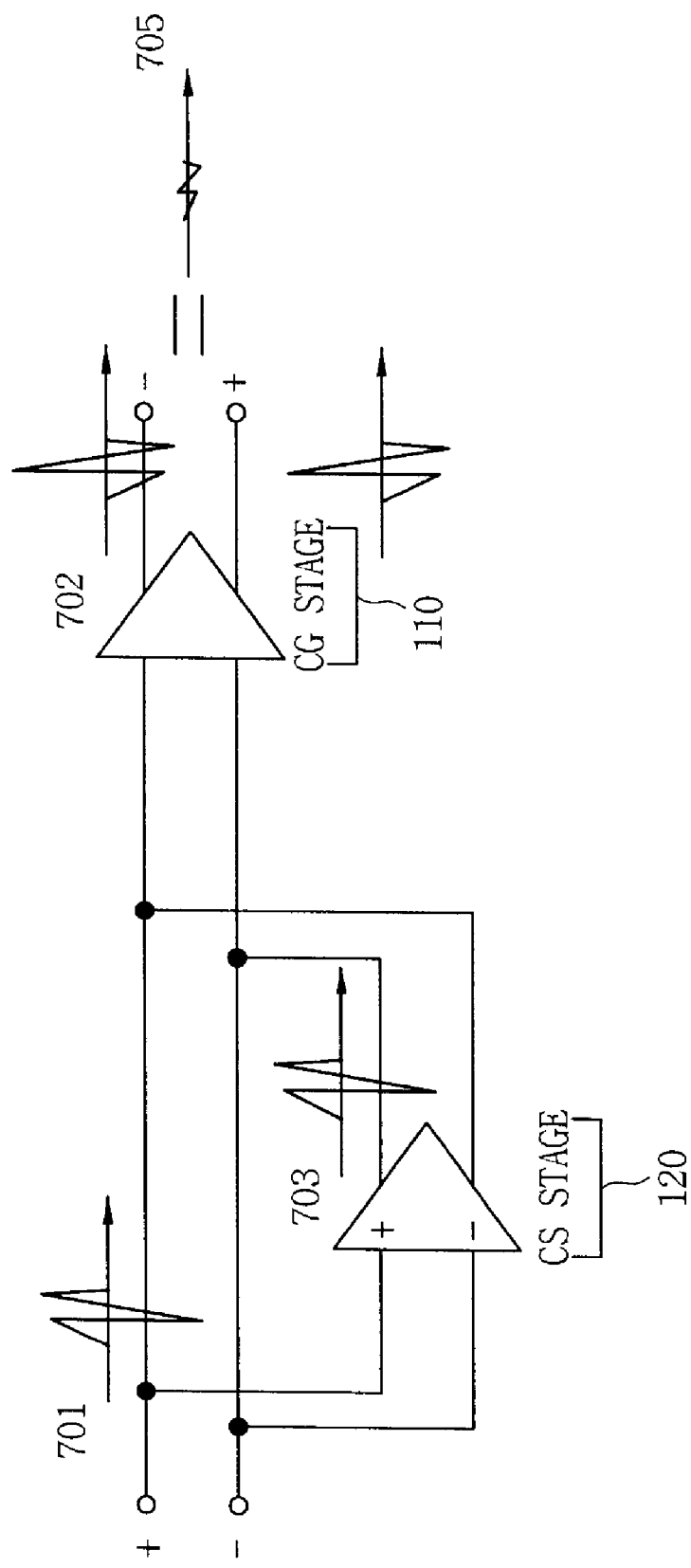

FIGS. 7A and 7B are views for explaining a process of removing a thermal noise signal, which may be performed by the low noise amplifier illustrated in FIG. 1.

FIGS. 7A and 7B shows thermal noise which is generated by a low noise amplifier 110 corresponding to a common gate circuit, and a harmonic and noise generator 120 corresponding to a common source circuit. In signal diagrams shown in FIGS. 7A and 7B, horizontal axes represent a time and vertical axes represent a noise voltage.

In detail, thermal noise 701 generated by a transistor M2 is phase-shifted by 180° by passing through a transistor M3 of the low noise amplifying unit 110, so that thermal noise 702 is output. Meanwhile, thermal noise 703 generated by the transistor M1 is phase-shifted by 180° by passing through a transistor M4 of the low noise amplifying unit 110, so that thermal noise 704 is output.

Then, the thermal noise 702 and 704 having opposite phases are added and cancelled, so that total thermal noise is reduced.

FIG. 7B is a simplified circuit diagram of the circuit illustrated in FIG. 7A. That is, since the phase of a noise signal generated by the transistors M3 and M4 of the common gate 110 is shifted by 180° from the phase of a noise signal generated by the transistors M1 and M2 of the common source 120, and the noise signals are added and cancelled, total thermal noise generated by the low noise amplifying unit 110 can be reduced.

Therefore, as described above, linearity of a low noise amplifier can be improved by providing a harmonic and noise generator in an input terminal of the low noise amplifying unit. Also, total noise can be attenuated by generating noise signals having a phase difference of 180° in the low noise amplifying unit.

Also, by connecting a harmonic and noise generator for removing noise in series to a broadband amplifying unit, without utilizing a separate device such as an adder, it is possible to reduce power consumption and the size of the chip. Accordingly, the low noise amplifier according to an embodiment of the present invention has low manufacturing costs and good linearity, and can efficiently remove thermal noise.

Also, in the low noise amplifier according to an embodiment of the present invention, by utilizing filter type impedance including resistors, inductors and parasitic capacitance, in the load terminal, broadband matching is possible.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A low noise amplifier, comprising:
   a low noise amplifying unit amplifying an input signal;
   a harmonic and noise generating unit disposed in an input terminal of the low noise amplifying unit, and generating a compensating signal for compensating for at least one of an intermodulation distortion signal and a thermal noise signal of the low noise amplifying unit; and
   a load unit outputting the amplified input signal generated by the low noise amplifying unit,
   wherein the load unit comprises a resistor and an inductor connected in series to the resistor, the load unit outputting a signal at an output node between the resistor and the inductor.

2. The low noise amplifier of claim 1, wherein the harmonic and noise amplifying unit and the low noise amplifying unit are connected in series to each other.

3. The low noise amplifier of claim 1, wherein the harmonic and noise generating unit generates an intermodulation distortion compensation signal phase-shifted by 180° from the intermodulation distortion signal generated by the low noise amplifying unit.

4. The low noise amplifier of claim 1, wherein the harmonic and noise generating unit generates a thermal noise compensation signal phase-shifted by 180° from that of a thermal noise signal generated by the low noise amplifying unit.

5. The low noise amplifier of claim 1, wherein the low noise amplifying unit is a common gate differential amplifier including at least one field effect transistor (FET).

6. The low noise amplifier of claim 1, wherein the harmonic and noise generating unit is a common source differential amplifier including at least one field effect transistor (FET), the harmonic and noise generating unit and the low noise amplifying unit receiving the same input signal, and
   wherein a drain of the at least one FET is connected to a gate of another FET which receives a first input signal different from a second input signal received by the at least one FET, the at least one FET being connected in series to the input terminal of the low noise amplifying unit.

7. The low noise amplifier of claim 1, wherein the low noise amplifying unit comprise a common gate differential amplifier, and wherein the harmonic and noise generating unit comprises a common source differential amplifier.

8. A low noise amplifier, comprising:
a low noise amplifying unit amplifying an input signal;
a harmonic and noise generating unit disposed in an input terminal of the low noise amplifying unit, and generating a compensating signal for compensating for at least one of an intermodulation distortion signal and a thermal noise signal of the input signal input to, the low noise amplifying unit; and
a load unit outputting the amplified input signal generated by the low noise amplifying unit,
wherein the harmonic and noise generating unit generates an intermodulation distortion compensation signal phase-shifted by 180° from the intermodulation distortion signal generated by the low noise amplifying unit.

9. The low noise amplifier of claim 8, wherein the harmonic and noise amplifying unit and the low noise amplifying unit are connected in series to each other.

10. The low noise amplifier of claim 8, wherein the low noise amplifying unit is a common gate differential amplifier including at least one field effect transistor (FET).

11. The low noise amplifier of claim 8, wherein the harmonic and noise generating unit is a common source differential amplifier including at least one field effect transistor (FET), the harmonic and noise generating unit and the low noise amplifying unit receiving the same input signal, and
wherein a drain of the at least one FET is connected to a gate of another FET which receives a first input signal different from a second input signal of the at least one FET, the at least one FET being connected in series to the input terminal of the low noise amplifying unit.

12. The low noise amplifier of claim 8, wherein the load unit comprises a resistor and an inductor connected in series to the resistor, the load unit outputting a signal generated between the resistor and the inductor.

13. The low noise amplifier of claim 8, wherein the low noise amplifying unit comprise a common gate differential amplifier, and
wherein the harmonic and noise generating unit comprises a common source differential amplifier.

14. The low noise amplifier of claim 8, wherein the harmonic and noise generating unit further generates a thermal noise compensation signal phase-shifted by 180° from that of a thermal noise signal generated by the low noise amplifying unit.

15. A low noise amplifier, comprising:
a low noise amplifying unit amplifying an input signal;
a harmonic and noise generating unit disposed in an input terminal of the low noise amplifying unit, and generating a compensating signal for compensating for at least one of an intermodulation distortion signal and a thermal noise signal of the input signal input to the low noise amplifying unit; and
a load unit outputting the amplified input signal generated by the low noise amplifying unit,
wherein the harmonic and noise generating unit generates a thermal noise compensation signal phase-shifted by 180° from that of a thermal noise signal generated by the low noise amplifying unit.

16. The low noise amplifier of claim 15, wherein the harmonic and noise amplifying unit and the low noise amplifying unit are connected in series to each other.

17. The low noise amplifier of claim 15, wherein the low noise amplifying unit is a common gate differential amplifier including at least one field effect transistor (FET).

18. The low noise amplifier of claim 15, wherein the harmonic and noise generating unit is a common source differential amplifier including at least one field effect transistor (FET), the harmonic and noise generating unit and the low noise amplifying unit receiving the same input signal, and
wherein a drain of the at least one FET is connected to a gate of another FET which receives a first input signal different from a. second input signal of the at least one FET, the at least one FET being connected in series to the input terminal of the low noise amplifying unit.

19. The low noise amplifier of claim 15, wherein the load unit comprises a resistor and an inductor connected in series to the resistor, the load unit outputting a signal generated between the resistor and the inductor.

20. The low noise amplifier of claim 15, wherein the low noise amplifying unit comprise a common gate differential amplifier, and
wherein the harmonic and noise generating unit comprises a common source differential amplifier.

\* \* \* \* \*